United States Patent [19]
Nakagawa et al.

[11] Patent Number: 5,389,878
[45] Date of Patent: Feb. 14, 1995

[54] ELECTRON SPIN RESONANCE DEVICE

[75] Inventors: Kazuo Nakagawa; Makoto Tsuneda; Atsushi Nukanobu, all of Tokyo; Akio Nakanishi; Akira Furuse, both of Osaka, all of Japan

[73] Assignees: Nikkiso Co., Ltd., Tokyo; Sumitomo Special Metals Co., Ltd., Osaka, both of Japan

[21] Appl. No.: 51,363

[22] Filed: Apr. 22, 1993

[30] Foreign Application Priority Data

Apr. 23, 1992 [JP] Japan .................................. 4-104343

[51] Int. Cl.6 ............................................ G01R 33/20
[52] U.S. Cl. ........................................................ 324/316
[58] Field of Search .............. 324/300, 307, 309, 316, 324/317, 318, 322; 128/653.2, 653.5

[56] References Cited

U.S. PATENT DOCUMENTS

| | | | |
|---|---|---|---|
| 3,350,633 | 10/1967 | Hyde | 324/316 |
| 3,931,569 | 1/1976 | Hyde | 324/316 |
| 4,803,624 | 2/1989 | Pilbrow et al. | 324/316 |
| 4,888,554 | 12/1989 | Hyde et al. | 324/316 |
| 4,998,064 | 3/1991 | Fuderer et al. | 324/309 |

FOREIGN PATENT DOCUMENTS

WO8801984 3/1988 WIPO .

OTHER PUBLICATIONS

Richard W. Quine et al., "Pulsed EPR spectrometer", Review of Scientific Instruments, vol. 58, No. 8, Sep. 1, 1987, pp. 1709–1723.

Günter Grampp, "Application of a microwave preamplifier to an ESR spectrometer", Review of Scientific Instruments, vol. 56, No. 11, Nov. 1, 1985, pp. 2050–2051.

Patent Abstracts of Japan, vol. 9, No. 224 (P-387) (1947), Sep. 10, 1985 (JPA 60-082983).

*Primary Examiner*—Michael J. Tokar
*Attorney, Agent, or Firm*—Sughrue, Mion, Zinn, Macpeak & Seas

[57] ABSTRACT

The invention provides an electron spin resonance device in which a measuring sample is arranged in a cavity resonator in a polarization magnetic field for a receipt of a predetermined microwave power and a subsequent resonance signal detection from said sample. A microwave signal amplifier is arranged on a prestage of a microwave detection circuit for an addition of a part of an output from a microwave oscillator at an input terminal of said amplifier so as to accomplish a balanced cancellation of a microwave reflective power from said cavity resonator.

4 Claims, 5 Drawing Sheets

MICROWAVE SWITCH 1

MICROWAVE SWITCH 2

CAVITY RESONATOR INPUT

CAVITY RESONATOR OUTPUT

REFLECTIVE POWER

MICROWAVE SIGNAL AMPLIFIER INPUT

TIME →

ELECTRON SPIN RESONANCE DEVICE

BACKGROUND OF THE INVENTION

The invention relates to an electron spin resonance device, and more particularly to an electron spin resonance device having a microwave circuit for detecting an electron resonance.

A typical structure of a microwave circuit for a conventional electron spin resonance device will be described with reference to FIG. 1. In the conventional electron spin resonance device, a microwave power is supplied into a wave-guide by a gun oscillator 12 which is driven by a power supply 10. The microwave power is transmitted though an uni-guide 14 and a directional coupler 16 to a wave-guide attenuator 18 which so adjusts the microwave power as to have an electric energy being suitable for a resonance condition of a measuring sample S. Such microwave power suitable adjusted is subsequently transmitted through a circulator 20 to a cavity resonator 22. In the cavity resonator 22, the microwave power is added into a measuring sample S which is arranged along a direction of a microwave magnetic field in the cavity resonator 22. A polarization magnetic field being perpendicular to the microwave magnetic field is applied by a pair of magnets 24.

When the measuring sample S is measured in the cavity resonator 22, the polarization magnetic field $B_0$ is swept. The electron resonance appears in the measuring sample only when the following condition is satisfied.

$$h = g\beta B_0 \qquad (1)$$

h: Planck's constant
$\mathcal{V}$: resonance frequency
g: Lande factor
$\beta$: Bohr magnetor If the electron resonance appears, a reflective output of a resonance signal from the cavity resonator 22 results.

Then, the resonance signal is transmitted again through the circulator 20 to a magic-T 26 which has both E-branch and H-branch. The resonance signal is transmitted through the E-branch of the magic-T 26 to a pair of crystal detectors 28 and 30 which are arranged at opposite sides of a balanced branch at the magic-T 26. The resonance signals supplied to the crystal detectors 28 and 30 have the same amplitude and inversive phases. The magic-T 26 at its H-branch is supplied from the directional coupler 16 through two coaxial waveguide convertors 34 and 36 with a part of the microwave power as a reference signal for such homodyne detection. The resonance signal is thus hybridized with the reference signal for a subsequent detection.

Detection outputs from the both crystal detectors 28 and 30 of the magic-T 26 are respectively added with the in-phase reference signal and the anti-phase resonance signal. As a result, each of the above detection outputs is subjected to a differential amplification by a preamplifier 38 for addition of resonance signal components but cancellation of reference signal components thereby the resonance signal component only remains.

On the other hand, the polarization magnetic field $B_0$ receives a modulation of the magnetic field with a modulation frequency $f_m$. The above microwave detection performance makes the preamplifier 38 amplify only the modulation frequency component for a subsequent transmission to a main amplifier which is not illustrated.

The main amplifier conducts a narrow band amplification of a center frequency $f_m$ for such a subsequent phase detection that the above center frequency $f_m$ serves as a reference frequency thereby the electron spin resonance signals as a direct output are obtained.

A sensitivity of a detection of the electron spin resonance signal is associated with a general noise factor F. In a case of the detection by multi-stage receiving system, the general noise factor F is given by the following equation.

$$F = F1 + (F2-1)/G1 + (F3-1)/G1G2, + + (Fn-1)/G1,G2,Gn-1 \qquad (2)$$

F1, F2, ... Fn: noise factor on each stage.
G1, G2, ... Gn: the amplification grade on each stage.

In the prior art, the electron spin resonance signal is detected by the cavity resonator 22 and transmitted through the circulator 20 for a receipt of diode detection by the crystal detectors 28 and 30 and a subsequent transmission to the preamplifier 38. That is why the sensitivity of the resonance signal detection is defined by the noise factor and the amplification grade of the detection diode.

The sensitivity of the resonance signal detection will be described with reference to numerical values when a Schottky barrier diode is used on a detecting stage. On the assumption that the noise factor F1 and the amplification grade G1 of the detector are 6 dB and −5 dB respectively (an amplification grade of approximately 0.3 times) and the noise factor of the signal amplifier F2 is 4 dB, the noise factor of the receiving system will be expressed as follows.

$$\begin{aligned} F &= F1 + (F2-1) + (F2-1)/G1 \\ &= 3.98 + (2.51-1)/0.316 \\ &= 8.72 \text{ (times)} \\ &= 9.4 \text{dB} \end{aligned}$$

In is apparent that in the prior art the noise factor of the receiving system is extremely high which teaches that the sensitivity of the resonance signal detection is undesirable.

SUMMARY OF THE INVENTION

Accordingly, it is an object of the present invention to provide an electron spin resonance device including an improved microwave circuit having a high sensitivity in a resonance signal detection.

The microwave circuit for the electron spin resonance device has such a circuit structure that a low noise microwave amplifier is arranged on a prestage of the resonance signal detection thereby accomplished is a balanced cancellation of a microwave power being applied to a measuring sample. This results in that the sensitivity of the resonance signal detection is independent of the microwave power being applied to the cavity resonator so that only the resonance signal receives a linear amplification for a facilitation of an improvement in the sensitivity.

In a novel electron spin resonance device, a measuring sample is arranged in a cavity resonator being arranged in a polarization magnet field for a supply of a microwave power to the measuring sample so that a resonance signal of the measuring sample is detected. Such novel electron spin resonance device is characterized in that a microwave signal amplifier is arranged on a prestage of a microwave detection circuit for detecting a resonance signal from the cavity resonator thereby a part of an output from a microwave oscillator is added to an input terminal of the amplifier for a subsequent balanced cancellation of a microwave reflective power from the cavity resonator.

Alternatively, the microwave signal amplifier is arranged on the prestage of the microwave detection circuit and the cavity resonator is arranged at a side of a microwave bridge for a balanced cancellation of a microwave overlapping the resonance signal.

Alternatively, it is available that the microwave signal amplifier is arranged on the prestage of the microwave detection circuit and there is provided a switching circuit which exhibits alternating opening and closing performance for both input into and output from the cavity resonator.

Alternatively, it is further available that a variable resistance attenuator and the microwave signal amplifier are arranged on the prestage of the microwave detection circuit for the balanced cancellation of the reflective microwave power from the cavity resonator.

According to the present invention, in the electron spin resonance device, the microwave signal amplifier is arranged on the prestage of the microwave detection circuit for detecting the resonance signal from the cavity resonator for the balanced cancellation of the microwave reflective power from the cavity resonator so as to have the resonance signal noise factor of the receiving system sufficiently lowered for a facility of an improvement in the sensitivity of the detection of the electron spin resonance signal.

Further, the cavity resonator is arranged on a side of the microwave bridge for the balanced cancellation of the microwave overlapping the resonance signal. Alternatively, there is provided a switching circuit exhibiting an alternating ON-OFF performance for input to and output from the cavity resonator for an amplification of only the resonance signal. These allow an improvement in the sensitivity of the detection of the electron spin resonance signal to be obtained.

Furthermore, both a various resistance attenuator and a microwave power amplifier are arranged on the prestage of the cavity resonator for receipt of such adjustments thereof as to accomplish a much more effective balanced cancellation of the reflective microwave power from the cavity resonator.

BRIEF DESCRIPTION OF THE DRAWINGS

Preferred embodiments of the present invention will hereinafter fully be described in detail with reference to the accompanying drawings.

PREFERRED EMBODIMENTS OF THE INVENTION

Figure 1:
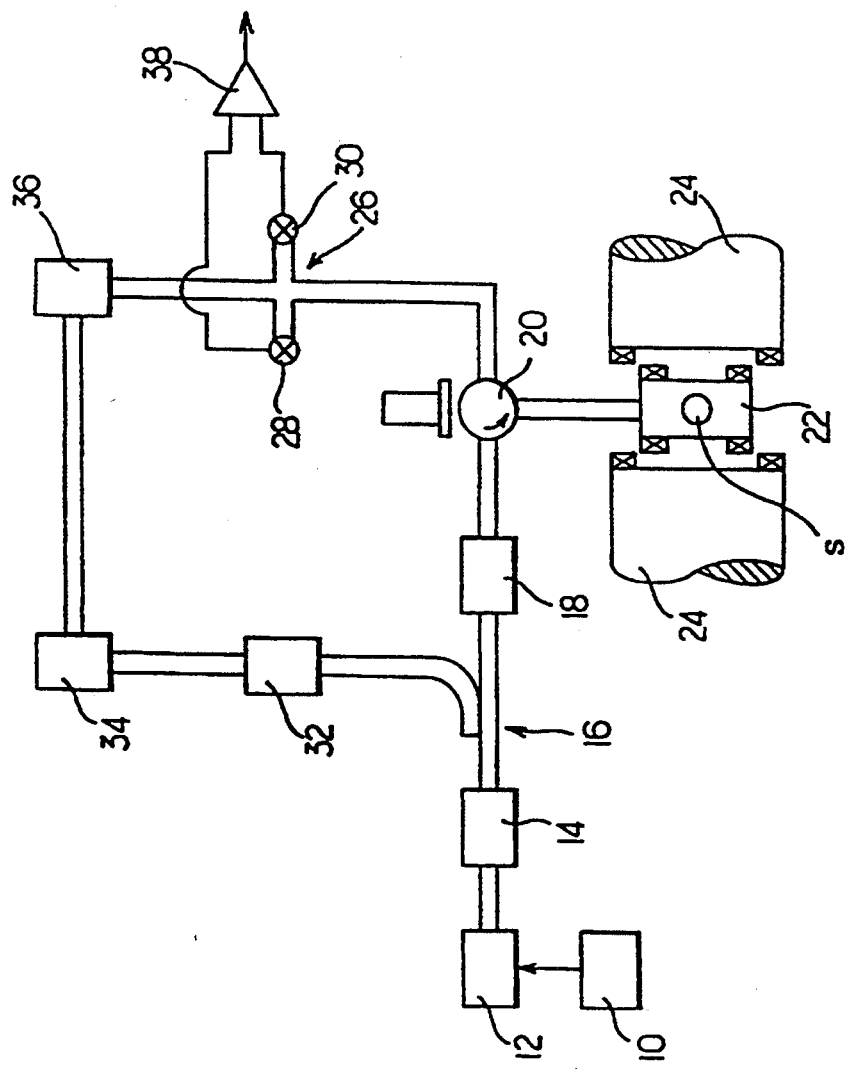
FIG. 1 is a circuit diagram of the conventional microwave circuit for the electron spin resonance device.
Figure 2:
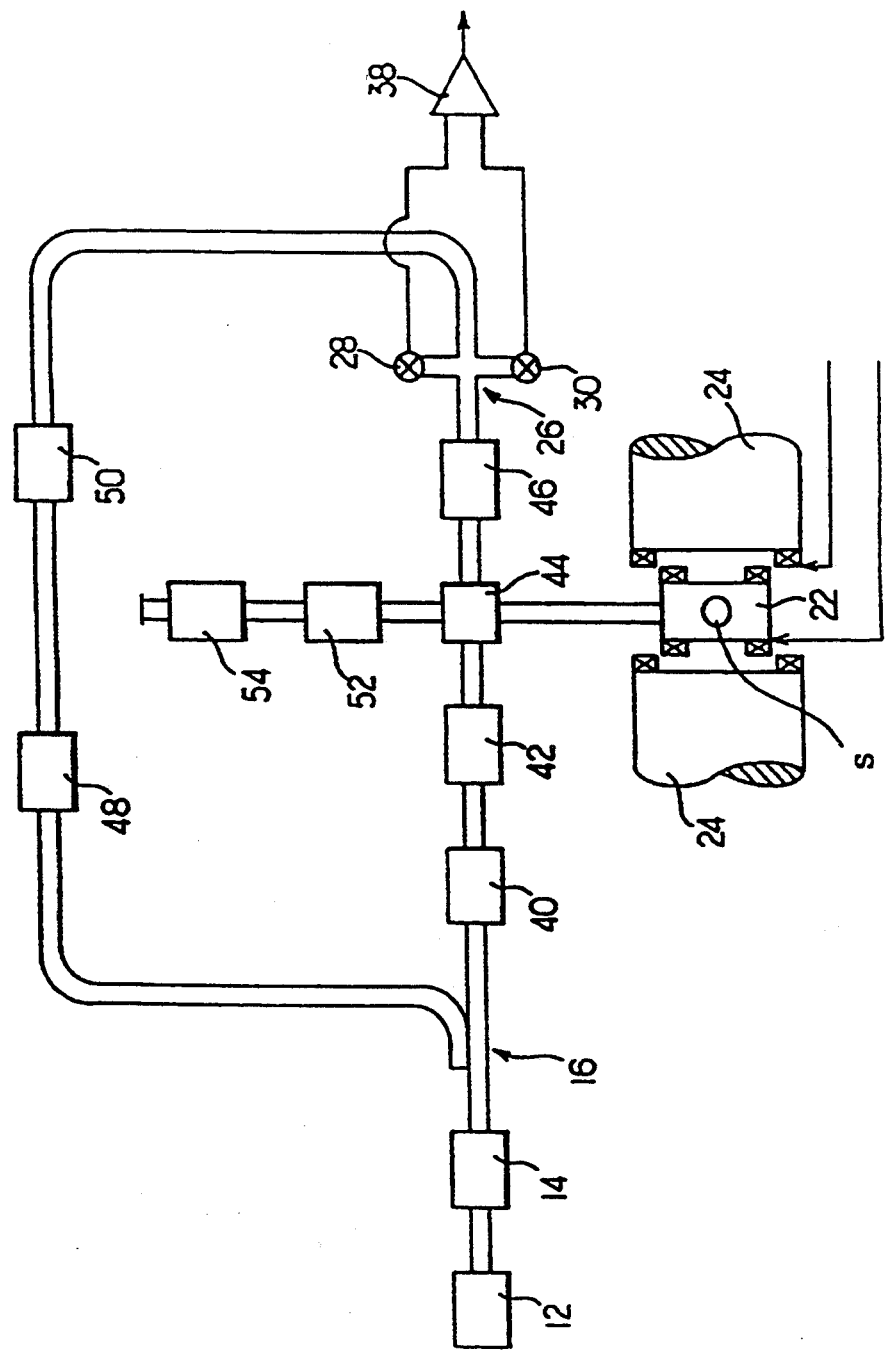
FIG. 2 is a circuit diagram of a novel microwave circuit for an electron spin resonance device of a first embodiment according to the present invention.

A first embodiment of the present invention will be described in detail with reference to FIG. 2.

A gun oscillator 12 supplies a microwave power for application to a cavity resonator 22. The microwave power supplied from the gun oscillator 12 is transmitted through both an uni-guide 14 and a directional coupler 16 to a variable resistance attenuator 40 which conducts such an adjustment of its electric power that the resonance condition of the measuring sample is satisfied. The adjusted microwave power is transmitted through both a microwave power amplifier 42 and a magic-T 44 to the cavity resonator 22 for being subsequently applied to the measuring sample S in the cavity resonator 22.

The reflective output of the resonance signal from the cavity resonator 22 is transmitted though the magic-T 44 and a microwave signal amplifier 46 to a magic-T 26. Although as the microwave signal resonator 46, such inexpensive and high reliable elements as GaAs FET and HEMT are available, such elements have a difficulty in not low noise factor in a wide band. To settle the above problem, a filter of a parallel connection of its $\lambda/4$ terminals is arranged between input and output terminals of the microwave signal amplifier 46 so that an amplification band wide of the microwave signal amplifier 46 is restricted for an improvement in the ratio of signal to noise. Alternatively, it is available to use an expensive semiconductor microwave signal amplifier 46 having a narrow band and a low noise factor. In this case, it is unnecessary to provide such a narrow band pass filter as $\lambda/4$ terminal short guide.

In this embodiment, a part of the microwave power as a reference signal is transmitted from the directional coupler 16 through a variable resistance attenuator 48 and a phase shifter 50 to a H-branch of the magic-T 26 so that the reference signal is hybridized with the resonance signal.

The noise factor and amplification degree of the above microwave signal amplification 46 are as follows.

F1=2 dB

G1=27 dB (amplification degree is approximately 0.3 times)

On the assumption of use of the detector of the same regulation as the microwave signal amplifier 46, the noise factor F2 and amplification degree G2 of the detector are 6 dB and $-5$ dB respectively. The noise factor F3 of the signal amplifier is 4 dB. It is expected that the noise factor F of the receiving system is expressed as follows.

$$\begin{aligned} F &= F1 + (F2 - 1)/G1 + (F3 - 1)/G1 \cdot G2 \\ &= 1.58 + (3.98 - 1)/501 + (2.51 - 1)/(501 \times 0.361) \\ &= 1.59 \\ &= 2.01 \text{ dB} \end{aligned}$$

As comparing the novel circuit of the invention to the circuit of the prior art, it may be expected that S/N ratio is $8.72/1.59 = 5.48$ times.

Actually, it is impossible to ignore the reflective microwave power from the cavity resonator 22. It events frequently that the microwave signal amplifier 46 becomes the super saturation state thereby the sensitivity is lowered. To settle the above problem, in case of a stereo circuit, the cavity resonator 22 is arranged on a side of the balanced branch of the magic-T 44. The phase shifter 52 and the variable resistance attenuator 54 are connected to opposite side of the balanced branch of the magic-T 44. The microwave power is supplied to the E-branch of the magic-T 44. The phase shifter 52 and the variable resistance attenuator 54 receive such adjustments that the reflective power from this branch has the same amplitude as and the inversive phase to the reflective power from the cavity resonator 22 thereby the output from the H-branch of the magic-T 44 becomes zero effectively. The microwave signal amplifier 46 is free from any affection provided from the strong applied microwave power so as to amplify only an insufficient resonance signal from the cavity resonant 22.

Although in this embodiment the typical example of the stereo circuit using the stereo circuit has been described, each element used in this embodiment is replaceable with corresponding planar circuit element for example the magic-T being replaceable with 180° hybrid-T.

As compared to the circuit of the prior art, the circuit provided by this embodiment of the present invention makes the noise factor much smaller and the amplification degree much larger thereby the general noise factor is lowered for accomplishment of the high sensitivity of the detection of the electron spin resonance signal. Although in the prior art the sensitivity of the detection is defined by the noise factor of the crystal detector, in this embodiment the low noise factor, a high gain microwave signal amplifier 46 allows the noise factor of the receiving system to be considerably improved.

Figure 3:
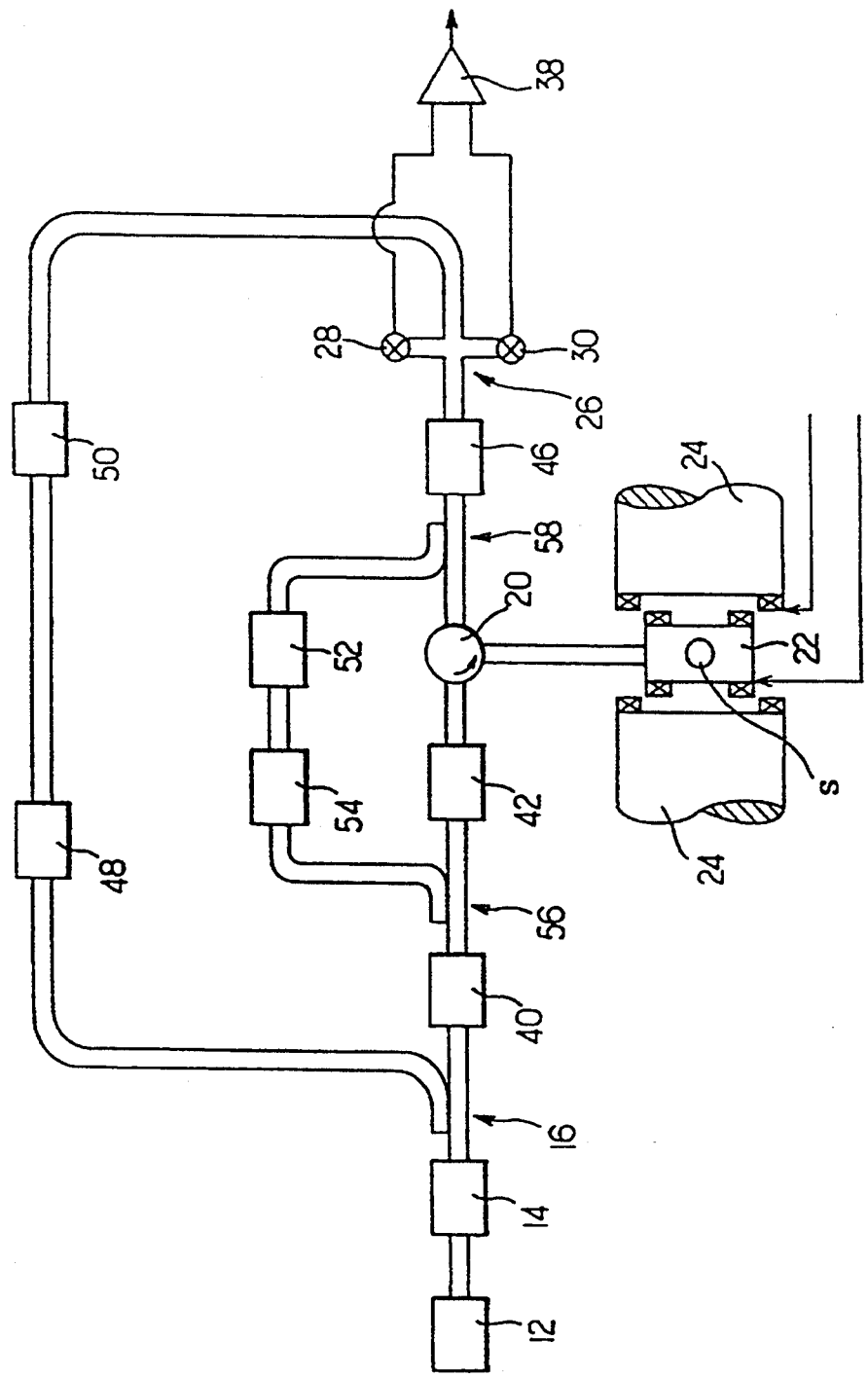
FIG. 3 is a circuit diagram of a novel microwave circuit for an electron spin resonance device of a second embodiment according to the present invention.

A second embodiment of the present invention will be described with reference to FIG. 3. In the second embodiment, the microwave bridge circuit has such a structure as to prevent a strong applied microwave from input to the microwave signal amplifier 46. Namely, the microwave power is transmitted to the cavity resonator 22 through the variable resistance attenuator 40, the directional coupler 56, the microwave power amplifier 42 and the circulator 20. The reflective power and the resonance signal from the cavity resonator 22 are transmitted through the circulator 20 and the directional coupler 58 to the microwave signal amplifier 46.

A part of the microwave power is transmitted as the reference power from the directional coupler 56 through the variable resistance attenuator 54 and the phase shifter 52 to a directional coupler 58 for being added to the reflective power from the cavity resonator 22. The resistance attenuator 58 conducts such an adjustment as to have the amplitude of the reference power become the same amplitude as that of the reflective power. The phase shifter also conducts such an adjustment as to have the phase inversive. This results in the balanced cancellation of the reflective power for a subsequent input of only the resonance signal into the microwave signal amplifier 46 thereby the noise factor of the receiving system is improved.

In the circuit, the output from the microwave oscillator 12 is enlarged by the microwave power amplifier 42 to cause a sufficient excitation of the measuring sample S. The power level receives from the variable resistance attenuator 40 such an adjustment as to match the resonance condition. The adjusted microwave power is supplied through the directional coupler 56 but only a constant ratio ($<0.1$) thereof as the reference signal.

That is why the balanced cancellation of the reflective signal at the directional coupler 58 is free from the operation of the adjustment of the microwave power.

A microwave power more than several hundreds mW is necessary to cause a sufficient excitation of the measuring sample S. The commercially available and inexpensive gun oscillator 12 has a too low power (10 mW to 20 mW). A gun oscillator 12 having a large output is expensive. The arrangement of an inexpensive microwave monolithic power amplifier 42 as illustrated in FIG. 3 allows a desirable microwave power to be obtained. The above way is of course applicable to those of the other embodiments of the present invention.

Figure 4:
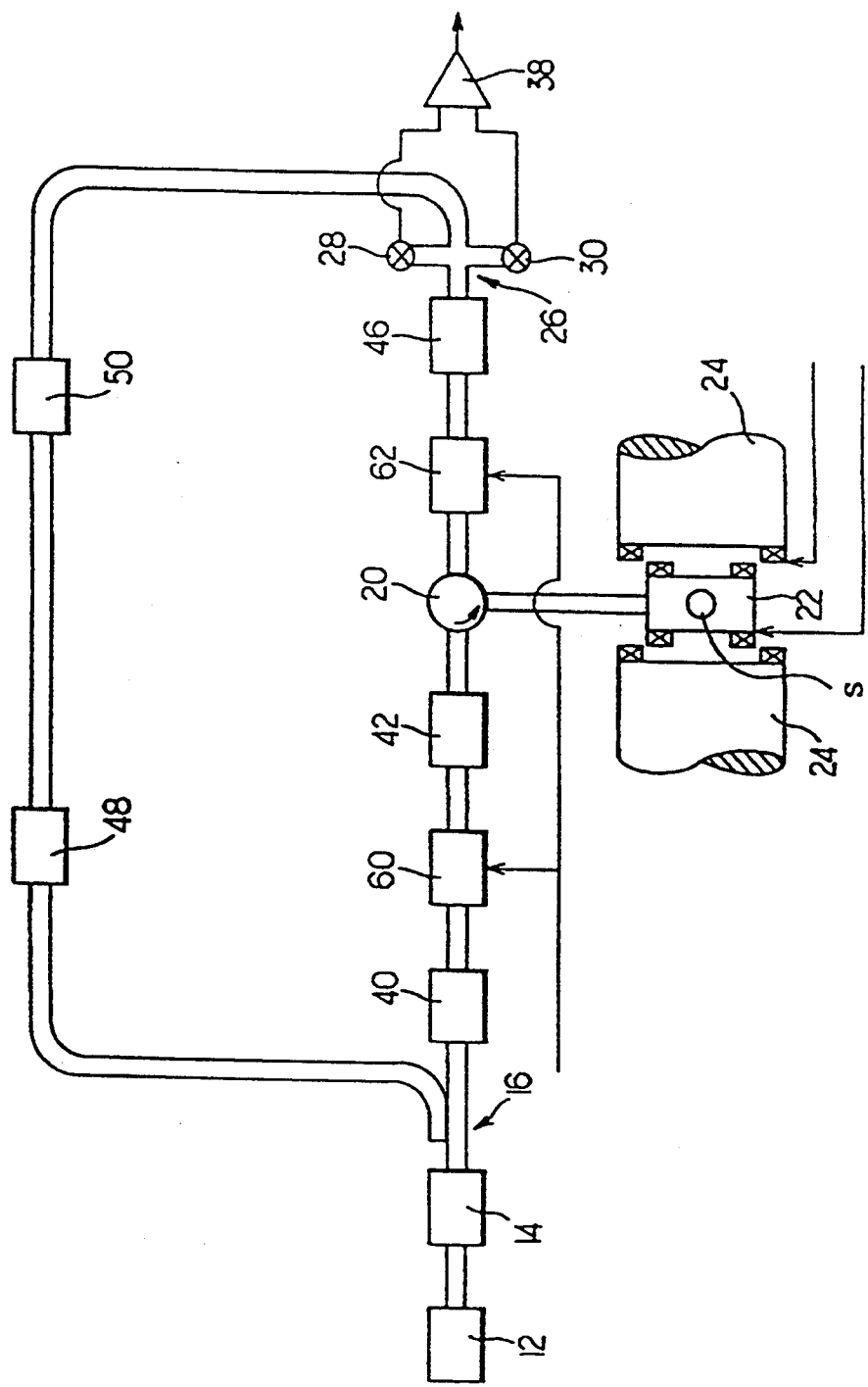
FIG. 4 is a circuit diagram of a novel microwave circuit for an electron spin resonance device of a third embodiment according to the present invention.

A third embodiment of the present invention will be described with reference to FIG. 4. In this embodiment, the microwave power receives cut-off by microwave switchs 60 and 62 being arranged both on a latter stage of the variable resistance attenuator 40 and on the prestage of the microwave signal amplifier 46 respectively. For the magnetic resonance, it is well known that a high frequency wave application excites a spin for a subsequent cut-off of the high frequency application thereby the intensity of the resonance signal exhibits an exponential attenuation at a time constant being a relaxation time which is a material constant for spin.

Figure 5:
FIG. 5 is a diagram of wave-forms of a microwave circuit illustrated in FIG. 4.
Figure 5:
Figure 5:
Figure 5:
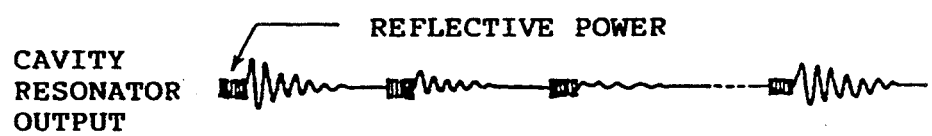
Figure 5:
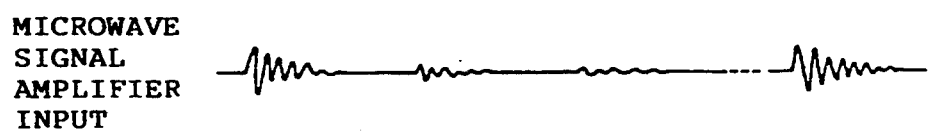

The circuit performance will be described with reference to FIG. 5. When the microwave switch 60 is closed for application of the microwave power to the cavity resonator 22, the microwave switch 62 is opened and an input terminal to the microwave signal amplifier 46 is closed. Although the measuring sample S is excited, the microwave signal amplifier 46 receives no input. After a short time passing in the order of microsecond, the microwave switch 60 is opened thereby the microwave switch 62 is closed. No microwave power for a strong excitation is transmitted to the cavity resonator 22 thereby the amplification function is free from the interference caused by its mixture for an effective amplification by the microwave signal amplifier 46 of only the resonance signal which remains for a short time defined by the relaxation time. Similarly to the above two embodiments, the noise factor of the receiving system is improved.

The resonance signal exhibits a normal output when for a lock-in detection a time constant of detection is set a sufficient long time as compared to a period of a discontinuous action of the microwave switch.

The transmission of the power through the gun oscillator 12, the uni-guide 14, the directional coupler 16, the variable resistance attenuator 48 and the phase shifter 50 to the H-branch of the magic-T 26 on the detection stage is to obtain the reference signal of the homodyne detection. The level of the reference signal defines a bias to the crystal detectors 28 and 30 for allowing the bias to the detectors 28 and 30 to be supported at a constant level in being free from a variation of the microwave power applied to the measuring sample S.

Whereas modifications of the present invention will no doubt be apparent to a person having ordinary skill in the art, to which the invention pertains, it is to be understood that the embodiments shown and described by way of illustrations are by no means intended to be considered in a limiting sense. Accordingly, it is to be intended to cover by claims all modifications which full within the sprit and scope of the invention.

What is claimed is:

1. An electron spin resonator provided with a cavity resonator applied with a polarized magnetic field in which a measuring sample is placed to extend along a microwave magnetic field vertical to said polarized magnetic field so as to supply a microwave power generated by a microwave oscillator through resistance attenuators to said measuring sample in said cavity resonator for detection of a resonant signal as a reflected power reflected from said measuring sample in said cavity resonator in order to detect an electron spin resonant signal of said measuring sample, characterized in that said microwave power generated by said microwave oscillator is divided by a directional coupler into a plurality of microwave powers so that one of said divided microwave powers is supplied through both a first variable resistance attenuator and a first microwave power amplifier into said cavity resonator as well as a resonant signal reflected from said measuring sample in said cavity resonator is supplied through a second microwave signal amplifier into a magic-T so as to supply an output signal of said microwave signal amplifier into an E-branch of said magic-T in which each of paired balance branches is provided with a crystal detector, while another of said microwave powers divided by said directional coupler is supplied through both a second variable resistance attenuator and a first phase shifter into an H-branch of said magic-T in which said another microwave power is supplied as a reference signal having the same amplitude as and an opposite phase to said output power of said microwave signal amplifier for detection and subsequent output of a resonant signal component only of said measuring sample by said crystal detectors prior to an amplification thereof.

2. An electron spin resonator as claimed in claim 1, wherein said magic-T is so provided as to supply a microwave power to said cavity resonator as well as said microwave power amplifier is arranged to connect with said E-branch of said magic-T and further said cavity resonator is arranged to connect with one side of said balance branch of said magic-T, while a second phase shifter and a third variable resistance attenuator are arranged to connect with opposite side of said balance branch so that a microwave reflective power reflected from said E-branch is supplied as a reference power with the same amplitude as and an opposite phase to the reflective power from the measuring sample in the cavity resonator for detection of a resonant signal reflected from said cavity resonator and subsequent output through said H-branch prior to an amplification thereof.

3. An electron spin resonator as claimed in claim 1, wherein a circulator is provided to supply said microwave power into said cavity resonator so that said first and second microwave amplifiers and said cavity resonator are connected through said circulator with one another whereby a microwave power outputted from said first variable resistance attenuator is divided through a second directional coupler into a plurality of microwave powers to supply one of said divided microwave powers through both a third variable resistance attenuator and a second phase shifter into a connective part between said circulator and said second microwave amplifier as well as to Supply another of said divided microwave powers through a third directional coupler as a reference power with the same amplitude as and an opposite phase to the reflective power from the measuring sample in the cavity resonator for effective detection of only a resonant signal reflected from said cavity resonator and subsequent output through said H-branch prior to an amplification thereof.

4. An electron spin resonator as claimed in claim 1, wherein a circulator is provided to supply said microwave power into said cavity resonator so that said first and second microwave amplifiers and said cavity resonator are connected through said circulator with one another thereby microwave switches for cutting microwave powers are respectively arranged between said first variable resistance attenuator and said first microwave amplifier as well as between said circulator and said second microwave amplifier for effective detection of only a resonant signal reflected from said cavity resonator subsequent output through said H-branch prior to an amplification thereof.

* * * * *